US008963376B2

(12) United States Patent
Kanayama (10) Patent No.: US 8,963,376 B2
(45) Date of Patent: Feb. 24, 2015

(54) ELECTRICAL LOAD DRIVING APPARATUS (75) Inventor: Mitsuhiro Kanayama, Takahama (JP)

(73) Assignee: Denso Corporation, Kariya (JP)

(*) Notice: Subject to any disclaimer, the term of this patent is extended or adjusted under 35 U.S.C. 154(b) by 658 days.

(21) Appl. No.: 13/314,285

(22) Filed: Dec. 8, 2011

(65) Prior Publication Data

US 2012/0161817 A1 Jun. 28, 2012

(30) Foreign Application Priority Data

Dec. 27, 2010 (JP) ................................. 2010-290904

(51) Int. Cl.
H01H 35/00 (2006.01)
G01R 31/00 (2006.01)
G01R 31/02 (2006.01)

(52) U.S. Cl.
CPC ............ *G01R 31/006* (2013.01); *G01R 31/026* (2013.01)
USPC ......................................................... 307/131

(58) Field of Classification Search
USPC .......................................................... 307/131
See application file for complete search history.

(56) References Cited

U.S. PATENT DOCUMENTS

| 6,411,137 | B2* | 6/2002 | Hattori et al. ................. 327/108 |
| 7,315,095 | B2* | 1/2008 | Kagemoto et al. ............. 307/39 |
| 2005/0194998 | A1* | 9/2005 | Watanabe ..................... 327/109 |

FOREIGN PATENT DOCUMENTS

| JP | 2003-158447 | 5/2003 |
| JP | 2004-120946 | 4/2004 |
| JP | 2005-039385 | 2/2005 |
| JP | 2008-154372 | 7/2008 |

* cited by examiner

Primary Examiner — Jared Fureman
Assistant Examiner — Duc M Pham
(74) Attorney, Agent, or Firm — Nixon & Vanderhye PC (57) ABSTRACT The electrical load driving apparatus includes means for alternately lowering the gate voltages of two current supply transistors connected in parallel to each other at regular time intervals, a current being supplied to an electrical load through drain-source paths of both the current supply transistors, and means for detecting wire breakage in two current supply wires in which the current supply transistors are interposed respectively at portions opposite the electrical load with respect to the current supply transistors based on the drain-source voltages of the current supply transistors.

7 Claims, 4 Drawing Sheets

ELECTRICAL LOAD DRIVING APPARATUS

This application claims priority to Japanese Patent Application No. 2010-290904 filed on Dec. 27, 2010, the entire contents of which are hereby incorporated by reference.

BACKGROUND OF THE INVENTION

1. Field of the Invention

The present invention relates to an electrical load driving apparatus for supplying a current to an electrical load through a plurality of transistors.

2. Description of Related Art

Japanese Patent Application Laid-open number 2003-158447 discloses such an electrical load driving apparatus having a structure in which a plurality of power supply wires are connected in parallel, one connection node of the power supply wires being connected to one end of an electrical load which is connected to one of the high voltage side and the low voltage side of a power source, the other node being connected to the other of the high voltage side and the low voltage side of the power source, and each of the power supply wires including a current supply transistor interposed therein. Accordingly, in this structure, a plurality of the current supply transistors are connected in parallel with one another, and connected in series to the electrical load.

In this apparatus, the current supply transistors are turned on during a current supply period in which the electrical load should be continuously supplied with a current.

According to the above structure, it is possible to maintain supply of a current to the electrical load even if one of the current supply wires is broken.

Further, the above electrical load driving apparatus is configured to generate sole-on periods within the current supply period, only a corresponding one of the current supply transistors being turned on during each sole-on period, and to monitor the voltage at the output terminals of the current supply transistors connected in parallel with one another during the sole-on period to determine whether or not the current supply transistor to be turned on within the sole-on period has an open failure in which the transistor is fixed to the off state.

This configuration makes it possible to detect an open failure of each current supply transistor, and also to detect a wire breakage of each current supply wire as an open failure of the current supply transistor regardless whether the wire breakage occurs at a portion on the near side of the current supply transistor, or at a portion on the far side of the current supply transistor with respect to the electrical load.

However, the above conventional electrical load driving apparatus has a disadvantage in reliability, because the sole-on period is generated within the current supply period.

More specifically, in a case where the electrical load is not a load that should be driven only a short period in response to a certain event, but a load that should be drive continuously (for example a relay for relaying power to an ignition system of a vehicle), since the failure detection is performed by turning on one of the current supply transistors during each sole-on period all the while the vehicle is running, the current supply transistors may degrade quickly.

In addition, if one of the current supply transistors has an open failure or if one of the current supply wires is broken, current supply to the electrical load is interrupted during each corresponding sole-on period.

SUMMARY

An exemplary embodiment provides an electrical load driving apparatus comprising:

a plurality of current supply wires connected in parallel with one another, each of the current supply wires being connected to one of a high side terminal and a low side terminal of a power source at one end thereof, and being connected to one end of an electrical load at the other end thereof, the other end of the electrical load being electrically connected with the other end of the high side terminal and the low side terminal of the power source;

a plurality of current supply transistors each having one control terminal and two output terminals, each of the current supply transistors being interposed in a corresponding one of the current supply wires at the two output terminals to supply a current to the electrical load when being turned on during a current supply period in which the electrical load should be supplied with the current continuously;

a check period generating means for generating, within the current supply period, a check period in which all of the current supply transistors are turned on in a low current supply performance state where a voltage difference between the two output terminals of each of the current supply transistors is higher than or equal to a predetermined voltage; and a wire breakage determination means connected to the two output terminals of each current supply transistor to detect whether or not the voltage difference between the two output terminals of any one of the current supply transistors is lower than the predetermined voltage, and determine, upon detecting that the voltage difference between the two output terminals of one of the current supply transistors is lower than the predetermined voltage, that the current supply wire interposed by the detected current supply transistor is broken at an opposite load side portion thereof located on the opposite side of the detected current supply transistor with respect to the electrical load.

According to the exemplary embodiment, there is provided an electrical load driving apparatus including a plurality of current supply transistors connected in parallel with one another to supply a current to an electrical load, and capable of detecting wire breakage in a plurality of current supply wires, in each of which a corresponding one of the current supply transistors is interposed, without placing a large current burden on the current supply transistors and without interrupting current supply to the electrical load.

Other advantages and features of the invention will become apparent from the following description including the drawings and claims.

PREFERRED EMBODIMENTS OF THE INVENTION

Figure 1:
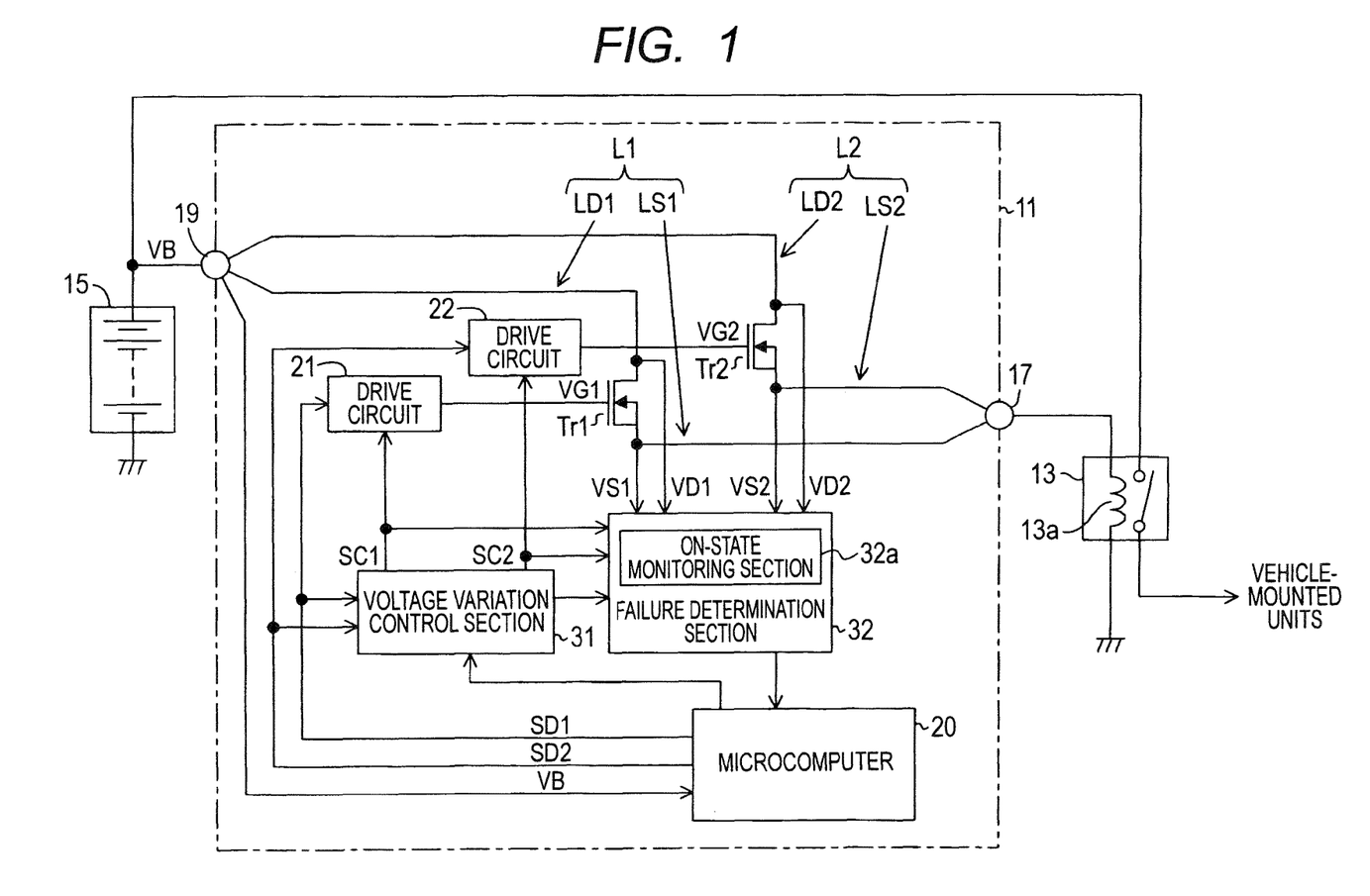
FIG. 1 is a diagram showing the structure of an ECU as an electrical load driving apparatus according to a first embodiment of the invention.

FIG. 1 is a diagram showing the structure of an ECU 11 as an electrical load driving apparatus according to a first embodiment of the invention.

The ECU 11 is mounted on a vehicle to turn on and off a relay 13 mounted on a vehicle by passing a current to a coil 13a of the relay 13. When the relay 13 is turned on, a battery voltage VB of a battery 15 is supplied to various vehicle-mounted units and devices related to the ignition system of the vehicle as a power supply voltage. More specifically, the ECU 11 turns on the relay 13 when a vehicle driver operates the ignition switch of the vehicle to supply the battery voltage VB to the various vehicle-mounted units and devices, and turns off the relay 13 when the vehicle driver turns off the ignition switch on condition that a predetermined power supply stop condition is satisfied.

In this embodiment, the relay coil 13a of the relay 13 is high side driven by the ECU 11. Accordingly, one end of the relay coil 13a is connected to the negative terminal of the battery 15 through a ground line of the vehicle outside the ECU 11.

The ECU 11 includes a terminal 17 connected to the other end of the relay coil 13a opposite to the ground line, a terminal 19 connected to the positive terminal (high side terminal) of the battery 15, and two current supply transistors Tr1 and Tr2 each of which passes a current to the relay coil 13a when turned on. In this embodiment, the transistors Tr1 and Tr2 are N-channel MOSFETs.

The two current supply transistors Tr1 and Tr2 are connected in parallel to each other, and connected in series to the relay coil 13a.

More specifically, the ECU 11 includes current supply wires L1 and L2 connected in parallel to each other, each of which is connected to the terminal 17 at one end thereof and connected to the terminal 19 at the other end thereof. The current supply wire L1 is interposed by the current supply transistor Tr1 such that the drain terminal is on the upstream side (on the terminal 19 side) and the source terminal is on the downstream side. The current supply wire L2 is interposed by the current supply transistor Tr2 such that the drain terminal is on the upstream side (on the terminal 19 side) and the source terminal is on the downstream side.

Hence, the current supply wire L1 includes a load side portion LS1 located on the near side of the relay coil 13a as an electrical load and connecting the source terminal of the current supply transistor Tr1 to the terminal 17 of the ECU 11, and an opposite load side portion LD1 located on the far side of the relay coil 13a and connecting the drain terminal of the current supply transistor Tr1 to the terminal 19 of the ECU 11. Likewise, the current supply wire L2 includes a load side portion LS2 located on the near side of the relay coil 13a as an electrical load and connecting the source terminal of the current supply transistor Tr2 to the terminal 17 of the ECU 11, and an opposite load side portion LD2 located on the far side of the relay coil 13a and connecting the drain terminal of the current supply transistor Tr2 to the terminal 19 of the ECU 11.

The ECU 11 includes a microcomputer 20 which controls current supply to the relay coil 13a, a drive circuit 21 which turns on and off the current supply transistor Tr1 in accordance with an on/off command signal SD1 outputted from the microcomputer 20, and a drive circuit 22 which turns on and off the current supply transistor Tr2 in accordance with an on/off command signal SD2 outputted from the microcomputer 20. The ECU 11 further includes a voltage variation control section 31 and a failure detecting section 32 for detecting wire breakage of the current supply wires L1 and L2.

The drive circuit 21 turns on the current supply transistor Tr1 by applying a drive voltage to the gate terminal as a control terminal of the current supply transistor Tr1 when the on/off command signal SD1 is at the active level (high level in this embodiment). The drive circuit 22 turns on the current supply transistor Tr2 by applying a drive voltage to the gate terminal as a control terminal of the current supply transistor Tr2 when the on/off command signal SD2 is at the active level (high level).

Figure 3:
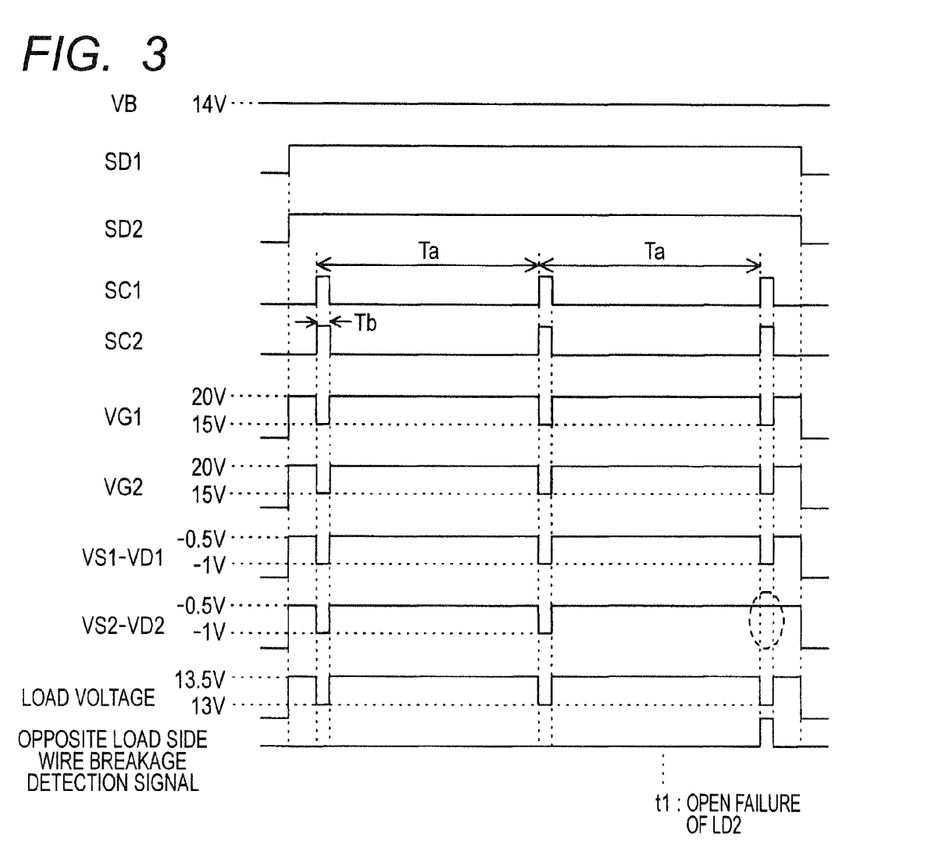
FIG. 3 is a time chart for explaining the operation of the ECU shown in FIG. 1.

Upon detecting that the vehicle driver turns on the ignition switch, the microcomputer 20 brings the on/off command signals SD1 and SD2 respectively supplied to the drive circuits 21 and 22 to the high level at the same time as shown in FIG. 3. Thereafter, upon detecting that the vehicle driver turns off the ignition switch, the microcomputer 20 brings the on/off command signals SD1 and SD2 to the low level on condition that a predetermined current supply stop condition is satisfied.

As explained above, the microcomputer 20 sets both the on/off command signals SD1 and SD2 at the high level to turn on both the current supply transistors Tr1 and Tr2 during a current supply period in which the relay coil 13a should be energized continuously, so that a current is supplied to the relay coil 13a through the two current supply transistors Tr1 and Tr2.

Although not shown in FIG. 1, the microcomputer 20 is inputted with a signal indicating that the vehicle driver turns on or off the ignition switch to detect whether the ignition switch is on or off. The current supply stop condition may be that a current supply stop permission signal transmitted on a signal line (not shown) is received from a vehicle-mounted unit supplied with electric power through the relay 13.

Next, the operations of the drive circuits 21 and 22 are explained in detail. Here, since the drive circuits 21 and 22 have the same structure, only the operation of the drive circuit 21 is explained.

Figure 2:
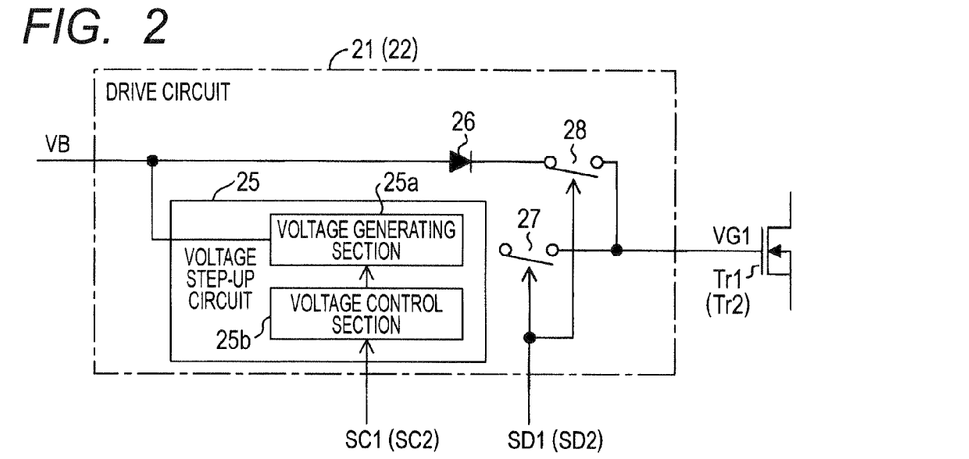
FIG. 2 is a diagram showing the structure of a drive circuit included in the ECU shown in FIG. 1.

As shown in FIG. 2, the drive circuit 21 includes a voltage step-up circuit 25 for stepping up the battery voltage VB (which is 12 to 14 V in this embodiment) being supplied to the ECU 11 through the terminal 19, a diode 26 whose anode is applied with the battery voltage VB, a switching element 27 as an analog switch connected between the voltage output terminal of the voltage step-up circuit 25 and the gate terminal of the current supply transistor Tr1, and a switching element 28 as an analog switch connected between the cathode of the diode 26 and the gate terminal of the current supply transistor Tr1.

The switching elements 27 and 28 turn on when the on/off command signal SD1 outputted from the microcomputer 20 is at the high level to connect the voltage output terminal of the voltage step-up circuit 25 and the cathode of the diode 26 to the gate terminal of the current supply transistor Tr1, and turn off when the on/off command signal SD1 outputted from the microcomputer 20 is at the low level to disconnect the voltage output terminal of the voltage step-up circuit 25 and the cathode of the diode 26 from the gate terminal of the current supply transistor Tr1.

The voltage step-up circuit 25 includes a voltage generating section 25a which generates a voltage higher than the battery voltage VB by stepping up the battery voltage VB and outputs the generated voltage from the voltage output terminal of the voltage step-up circuit 25, and a voltage control section 25b which adjusts the voltage generated by the voltage generating section 25a.

The voltage control section 25b adjusts the voltage generated by the voltage generating section 25a to a voltage (20 V, for example) high enough to turn on the current supply transistor Tr1 completely in its saturation state by being applied to the gate terminal of the current supply transistor Tr1, when a later explained voltage variation command signal SC1 outputted from the voltage variation control section 31 is at the non-active level (low level in this embodiment). This voltage is referred to as "completely turning-on voltage" hereinafter.

On the other hand, the voltage control section 25b adjusts the voltage generated by the voltage generating section 25a to a specific voltage higher than the battery voltage VB and lower than the completely turning-on voltage. This specific voltage is a voltage for turning on the current supply transistor Tr1 by being applied to the gate terminal of the current supply transistor Tr1 in a state where the current supply performance of the current supply transistor is lower than that when being applied with the completely turning-on voltage. This specific voltage (15 V, for example) makes the drain-source voltage of the current supply transistor Tr1 at a certain voltage higher than that when the current supply transistor Tr1 is in the completely-on state. This specific voltage is referred to as "current supply performance lowering voltage" hereinafter.

Hence, as shown in FIG. 3, when the on/off command signal SD1 outputted from the microcomputer 20 is at the high level, and the voltage variation command signal SC1 is at the low level, the gate voltage VG1 of the current supply transistor Tr1 is at the completely turning-on voltage (20 V) generated by the voltage step-up circuit 25, and as a result, the drain-source voltage of the current supply transistor Tr1 become 0.5 V, for example. Accordingly, as exemplified in FIG. 3, when the battery voltage VB is 14 V, the on/off command signal SD1 outputted from the microcomputer 20 is at the high level, and the voltage variation command signal SC1 is at the low level, the source voltage VS1 as the output voltage of the current supply transistor TR1 becomes 13.5 V which is lower than the drain voltage VD1 equal to the battery voltage VB (14 V) by 0.5 V.

In FIG. 3, the description "VS1–VD1" means the source voltage VS1 minus the drain voltage VD1 of the current supply transistor Tr1, which is the sign-inverted version of the drain-source voltage of the current supply transistor Tr1. Likewise, the description "VS2–VD2" means the sign-inverted version of the drain-source voltage of the current supply transistor Tr2, and the description "LOAD VOLTAGE" means the voltage applied to the relay coil 13a through the terminal 17 of the ECU 11 (that is, the source voltages VS1 and VS2 of the current supply transistors Tr1 and Tr2).

On the other hand, as shown in FIG. 3, when the on/off command signal SD1 outputted from the microcomputer 20 is at the high level, and the voltage variation command signal SC1 is at the high level, the gate voltage VG1 of the current supply transistor Tr1 is at the current supply performance lowering voltage (15 V), and as a result, the current supply transistor Tr1 turns on in a low current supply performance state where the drain-source voltage is at a value lower than that when the current supply transistor Tr1 is in the completely on state. Hence, as shown in FIG. 3, when the battery voltage VB is 14 V, and both the on/off command signal SD1 and the voltage variation command signal SC1 are at the high level, the source voltage VS1 of the current supply transistor Tr1 becomes 13.0 V which is lower than the battery voltage VB (14 V) by 1.0 V.

The above descriptions of the structure and operation of the drive circuit 21 can be applied to the drive circuit 22 except that the on/off command signal SD1 outputted from the microcomputer 20 is replaced by the on/off command signal SD2, the voltage variation command signal SC1 outputted from the voltage variation control section 31 is replaced by the voltage variation command signal SC2, and the current supply transistor Tr1 is replaced by the current supply transistor Tr2.

Although not shown in the drawings, each of the current supply transistors Tr1 and Tr2 is provided with a malfunction-preventing resistor connected between the gate terminal and the source terminal. Accordingly, when the on/off command signals SD1 or SD2 is changed to the low level to turn off the switching element 27 or 28 of the drive circuit 21 or 22, since the gate-source voltage of the current supply transistor Tr1 or Tr2 becomes 0 V, the current supply transistor Tr1 or TR2 completely turns off.

Further, in the unlikely case where the output voltage of the voltage step-up circuit 25 decreases below the current supply performance lowering voltage (decreases to 0 V, for example) when the on/off command signal SD1 or SD2 is at the high level, since the gate terminal of the current supply transistor Tr1 or TR2 is applied with a voltage equal to the battery voltage VB minus the forward voltage Vf (about 0.6 V) of the diode 26, it is possible to turn on the current supply transistor Tr1 or Tr2 in a state where a necessary minimum current is passed to the relay coil 13a although the current supply performance in this state is lower than that in the low current supply performance state. That is, the diode 26 and the switching element 28 are provided to enable the fail-safe operation for each of the drive circuits 21 and 22.

Next, the operation of the voltage variation control section 31 is explained. The voltage variation control section 31 is configured to vary the source voltages VS1 and VS2 (output voltages) of the current supply transistors TR1 and Tr2 by varying their gate voltages VG1 and VG2 during the current supply period in which both the on/off command signals SD1 and SD2 outputted from the microcomputer 20 are at the high level. More specifically, the voltage variation control section 31 is configured to alternately bring the voltage variation command signals SC1 and SC2 respectively supplied to the drive circuits 21 and 22 to the high level at intervals of a predetermined time Ta for a predetermined time Tb shorter than the time Ta, as shown in FIG. 3.

Accordingly, the period of the time Tb during which both the current supply transistors Tr1 and Tr2 are turned on in the low current supply performance state occurs at intervals of the time Ta within the current supply period of the relay coil 13a. In this embodiment, the period of the time Tb is a check period for detecting wire breakage of the opposite load side portion LS1 or LS2 of the current supply wires L1 or L2.

As shown in FIG. 3, in this embodiment, assuming that the battery voltage VB is 14 V, when both the voltage variation command signals SC1 and SC2 are changed to the high level as a result of which the gate voltages VG1 and VG2 of the current supply transistors Tr1 and Tr2 decrease from the completely turning-on voltage (20 V) to the current supply performance lowering voltage (15 V), since the drain-source voltages of the current supply transistors Tr1 and Tr2 increase from 0.5 V to 1.0 V, and the source voltages VS1 and VS2 of the current supply transistors Tr1 and Tr2 decrease from 13.5 V to 13.0 V, the voltage of the terminal 17 as the load voltage applied to the relay coil 13a decreases from 13.5 V to 13.0 V.

The microcomputer 20 allows the voltage variation control section 31 to operate to set the voltage variation command signal SC1 or SC1 at the high level. Next, the operation of the failure detecting section 32 is explained.

The failure detecting section 32 is connected to the output terminals (the drain terminal and the source terminal) of each of the current supply transistors Tr1 and Tr2. The voltage variation command signals SC1 and SC2 outputted from the voltage variation control section 31 are inputted also to the failure detecting section 32.

Figure 4:
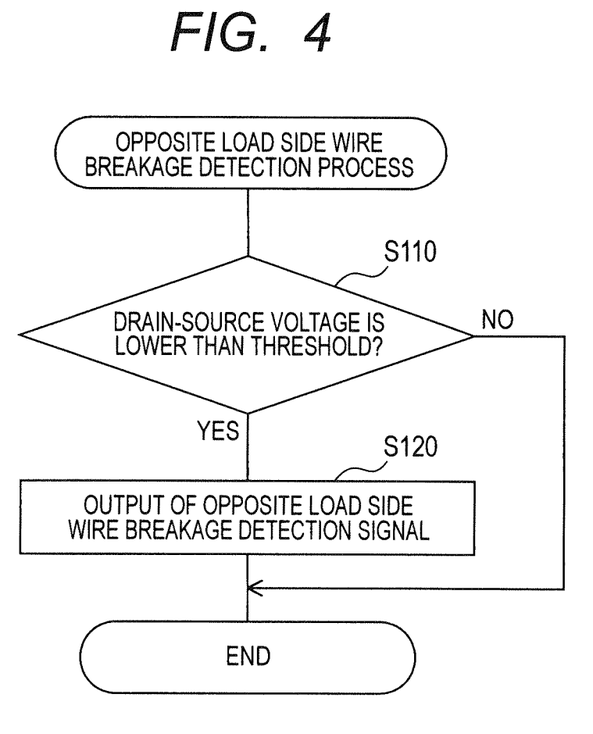
FIG. 4 is a flowchart showing an opposite load side wire breakage detection process performed by a failure detecting section included in the ECU shown in FIG. 1.

The failure detecting section 32 performs an opposite load side wire breakage detection process shown in FIG. 4 to detect wire breakage of the opposite load side portions LD1 and LD2 of the current supply wires L1 and L2 during the check period in which both the voltage variation command signals SC1 and SC2 are set to the high level.

As shown in FIG. 4, the opposite load side wire breakage detection process begins in step S110 to determine whether or not each of the drain-source voltages of the current supply transistors Tr1 and Tr2 is lower than a predetermined threshold value. If the determination result in step S110 is affirmative, the process proceeds to step S120 to output an opposite load side wire breakage detection signal indicating that one of the opposite load side portions LD1 and LD2, which is connected with the current supply transistor whose drain-voltage source is detected to be lower than the threshold value, to the microcomputer 20.

In this embodiment, since the drain-source voltages of the current supply transistors Tr1 and Tr2 are higher than 1 V when the voltage variation command signals SC1 and SC2 are at the high level in the normal state where there is no wire breakage, the threshold value is set lower than 1 V (0.7 V, for example). Upon receiving the opposite load side wire breakage detection signal from the failure detecting section 32, the microcomputer 20 stores a failure code indicating occurrence of a failure identified by the opposite load side wire breakage detection signal in the nonvolatile memory, and performs a warning process to inform the vehicle driver of occurrence of the failure by turning on a warning light or showing a message corresponding to the detected failure on a display.

Next, the principle of detecting wire breakage of the opposite load side portions LD1 and LD2 is explained. In the normal state where there is no wire breakage (before time ti in FIG. 3), the drain-source voltages of the current supply transistors Tr1 and Tr2 are at 1 V during the check period in which both the voltage variation signals SC1 and SC2 are set to the high level.

If any one of the opposite load side portions LD1 and LD2 is broken, since no current flows through the current supply transistor Trx (x being 1 or 2) connected to the broken opposite load side portion LDx, the relay coil 13a is supplied with a current only through the other current supply transistor. As a result, the drain-source voltage of the current supply transistor connected to the opposite load side portion which is not broken becomes higher than or equal to 1 V, while the drain-source voltage of the current supply transistor Trx connected to the opposite load side portion LDx which is broken becomes lower than 1 V reliably, because no current flows through the current supply transistor Trx.

Accordingly, in this embodiment, the threshold value used in step S110 shown in FIG. 4 is set lower than 1 V (0.7 V, for example) to enable determining that the opposite load side portion of the current supply wire connected with the current supply transistor whose drain-source voltage is lower than the threshold value during the check period is broken.

For example, if the opposite load side portion LD2 of the current supply wire L2 is broken at time t1as shown in FIG. 3, when there comes the check period of the length of the time Tb in which both the voltage variation command signals SC1 and SC2 are set to the high level, the drain-source voltage of the current supply transistor Tr1 becomes 1 V, while the drain-source voltage of the current supply transistor Tr2 becomes 0.5 V lower than the threshold value. Accordingly, the opposite load side portion LD2 connected with the current supply transistor Tr2 is determined to be broken. Incidentally, although the current supply transistors and the current supply wires are two in number, they may be three or more in number.

The failure detecting section 32 includes an on-state monitoring section 32a. The on-state monitoring section 32a is activated when both the on/off command signals SD1 and SD2 outputted from the microcomputer 20 are at the high level to monitor the drain-source voltages of the current supply transistors Tr1 and Tr2. Upon detecting that any one of the drain-source voltages of the current supply transistors Tr1 and Tr2 exceeds a specific value Vdso set for detecting abnormality, the on-state monitoring section 32a outputs a circuit abnormality signal to the microcomputer 20.

The specific value Vdso is set to a value (4 V, for example) higher than the drain-source voltage (1 V) when the current supply transistors Tr1 or Tr2 is turned on in the low current supply performance state. The voltage variation control section 31 is configured to set a current-supply-period signal outputted to the failure detecting section 32 to the high level during the current supply period in which both the on/off command signals SD1 and SD2 outputted from the microcomputer 20 are at the high level. The failure detecting section 32 operates while the current-supply-period signal is at the high level. The failure detecting section 32 may be inputted with the on/off command signals SD1 and SD2 outputted from the microcomputer 20 instead of the current-supply-period signal.

Next, a voltage variation control inhibition process which the microcomputer 20 performs in connection with the wire breakage detection for the current supply wires L1 and L2 is explained with reference to FIG. 5. The microcomputer 20 performs this voltage variation control inhibition process at regular time intervals during the current supply period in which the microcomputer 20 sets both the on/off command signals SD1 and SD2 at the high level. The microcomputer 20 allows the voltage variation control section 31 to operate immediately after being powered on.

Figure 5:
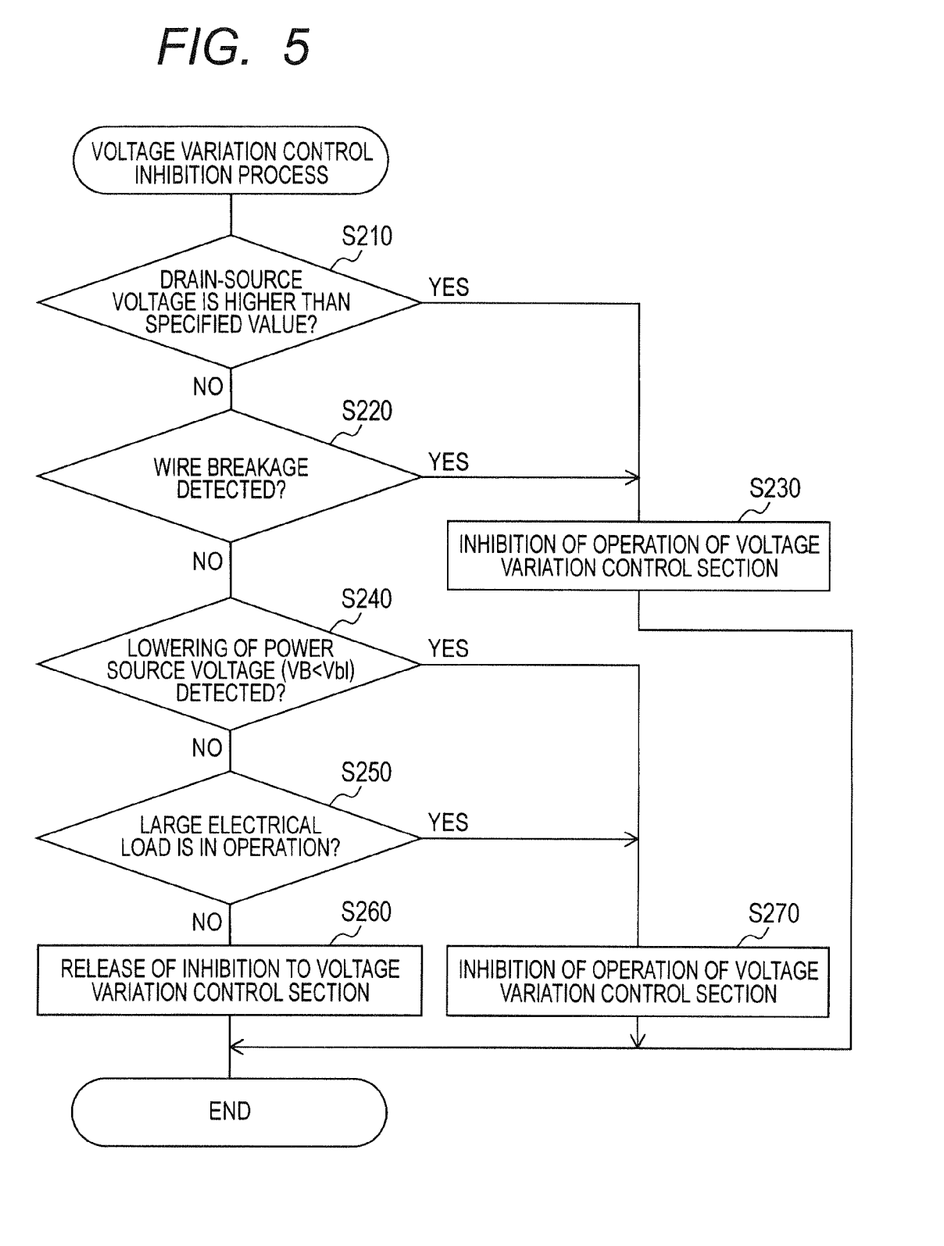
FIG. 5 is a flowchart showing a voltage variation control inhibition process performed by a microcomputer included in the ECU shown in FIG. 1.

As shown in FIG. 5, the voltage variation control inhibition process begins in step S210 to determine whether the drain-source voltage of any one of the current supply transistors Tr1 and Tr2 exceeds the specified value Vdso based on whether or not the circuit abnormality signal has been outputted from the failure detecting section 32.

If the determination result in step S210 is negative, the process proceeds to step S220. In step S220, it is determined whether or not the failure detecting section 32 has detected wire breakage of the current supply wire L1 or L2 at the opposite load side portion LD1 or LD2. More specifically, it is determined whether or not the opposite load side wire breakage detection signal has been outputted from the failure detecting section 32. If the determination result in step S220 is negative, the process proceeds to step S240.

On the other hand, if the determination result in step S210 or step S220 is affirmative, the process proceeds to step S230. In step S230, the voltage variation control section 31 is inhibited from operating to prevent the voltage variation command signals SC1 and SC2 from being set to the high level, and then this process is terminated.

The inhibition to the voltage variation control section 31 continues after the present current supply period of the relay coil 13a ends and the next current supply period comes. The microcomputer 20 releases the inhibition to the voltage variation control section 31 to allow the voltage variation control section 31 to operate when the microcomputer 20 restarts thereafter, or when the microcomputer 20 receives an inhibition release signal transmitted from outside of the ECU 11.

In step S240, the battery voltage VB received through the terminal 19 is A/D-converted, and it is determined whether or not the battery voltage VB has decreased below a predetermined low voltage detection threshold Vbl. If the determination result in step S240 is negative, the process proceeds to step S250. The low voltage detection threshold Vbl is set to a value (10 V, for example) lower than the normal range of the value of the battery voltage VB.

In step S250, it is determined whether or not at least one of specific electrical loads (the starter or defogger, for example) which may cause the battery voltage VB to drop below the low voltage detection threshold Vbl has been powered on or supplied with a current, based on information showing control states of the specific electrical loads received from vehicle-mounted units for controlling theses electrical loads. If the determination result in step S250 is negative, the process proceeds to step S260 to release inhibition made in the later described step S270, and then this process is terminated.

If the determination result in step S240 or step S250 is affirmative, the process proceeds to step S270 assuming that the battery voltage VB is lower than the low voltage detection threshold Vbl.

In step S270, the voltage variation control section 31 is inhibited from operating, and then this process is terminated. The inhibition to the voltage variation control section 31, which is released in step S260, is for inhibiting the voltage variation control section 31 from operating when the determination result in step S240 or S250 is affirmative.

According to the above described process performed by the ECU 11 makes it possible to detect wire breakage in the opposite load side portions LD1 and LD2 of the current supply wires L1 and L2 respectively connected with the current supply transistors Tr1 and Tr2. Further, since the relay coil 13*a* is supplied with a current through all the current supply transistors Tr1 and Tr2 during the current supply period of the relay coil 13*a*, it can be prevented that the current supply transistors Tr1 and Tr2 are overloaded, and that current supply to the relay coil 13*a* is interrupted when one of the current supply wires L1 and L2 is broken.

In this embodiment, since the check period is generated intermittently during the current supply period, the wire breakage detection can be performed for the opposite load side portion LD1 and the opposite load side portion LD2 intermittently and repeatedly.

In this embodiment, when the drain-source voltage of any one of the current supply transistors Tr1 and Tr2 exceeds the specific value Vdso during the current supply period of the relay coil 13*a*, it is detected in steps S210 and S230 shown in FIG. 5, and as a result the voltage variation control section 31 is inhibited from operating thereafter.

Accordingly, if there occurs a circuit abnormality in which the output voltage of the voltage step-up circuit 25 decreases below the current supply performance lowering voltage when the voltage variation command signal SC1 is set to the high level due to abnormality in the voltage control section 25*b* of the voltage step-up circuit 25 of one or both of the drive circuits 21 and 22 (it is assumed that the abnormality is in only the drive circuit 21 in the following description), and as a result, the drain-source voltage of the current supply transistor Tr1 exceeds the specified value Vdso, the voltage variation command signals SC1 and SC2 are inhibited from being set to the high level thereafter. Accordingly, according to the above embodiment, it is possible to prevent the power loss of the current supply transistor Tr1 from becoming excessively large, and to prevent the current supplied to the relay coil 13*a* from being reduced. The above explanation applies also to the drive circuit 22 and the current supply transistor Tr2.

The on-state monitoring section 32*a* of the failure detecting section 32 may be configured to monitor the drain-source voltage of only one of the current supply transistors Tr1 and Tr2. However, in this embodiment, the on-state monitoring section 32*a* of the failure detecting section 32 is configured to monitor the drain-source voltages of both the current supply transistors Tr1 and Tr2 to increase the reliability of the failure detection. The on-state monitoring section 32*a* may be configured to operate to monitor the drain-source voltages of the current supply transistors Tr1 and Tr2 only during the check period in which the voltage variation command signals SC1 and SC2 are set to the high level within the current supply period of the relay coil 13*a*.

According to this embodiment, since the voltage variation control section 32 is inhibited from operating after any one of the current supply wires L1 and L2 is detected to be broken by the failure detecting section 32, it is possible to prevent the current supplied to the relay coil 13*a* from being reduced because the current supply transistor connected to the normal one of the current supply wires is not set to the low current supply performance state.

Further, according to this embodiment, it is possible to turn on the current supply transistors Tr1 and Tr2 in a state enabling to supply a current to the coil 13*a* necessary to turn on the relay 13, even if the drive voltage applied to the gate terminals of the current supply transistors Tr1 and Tr2 is decreased below a value minimally necessary to turn on the current supply transistors Tr1 and Tr2 due to failure of the voltage step-up circuit 25 or the switching element 27 of the drive circuit 21 or 22, because of the provision the diode 26 and the switching element 28.

In addition, according to this embodiment, it is possible to prevent the current supplied to the relay coil 13*a* from being excessively reduced when the battery voltage VB is low, causing the voltage variation command signals SC1 and SC2 to be at the high level, because step S270 inhibits the voltage variation control section 31 from operating when the battery voltage VB is detected to be lower than the low voltage detection threshold Vbl in step S240 or S250. Further, one of steps S240 and S250 may be omitted.

In this embodiment, the relay coil 13*a* is an object to be supplied with a current, however, the relay 13 itself can be assumed as an object to be driven.

Further, the above embodiment may be modified such that, with the decrease of the battery voltage VB, the degree of lowering of the current supply performance of the current supply transistors Tr1 and Tr2 during the check period is decreased, the check period of the length of the time Tb is shortened, or the generation interval of the time Ta of the check period is lengthened, in order to prevent the current supplied to the relay coil 13*a* from being reduced.

Further, the above embodiment may be modified such that the circuit abnormality signal and the opposite load side wire breakage detection signal outputted from the failure detecting section 32 are inputted to the voltage variation control section 31, and the failure detecting section 32 stops operation when any one of the circuit abnormality signal and the opposite load side wire breakage detection signal is received. In this modification, steps S210 to S230 in the process shown in FIG. 5 may be omitted.

Further, steps S240 to S270 may be performed by a circuit other than the microcomputer 20. It is a matter of course that various modifications can be made to the above embodiments as described below.

The microcomputer 20 may be configured to output the on/off command signals SD1 and SD2 from the same terminal instead of from the separate two terminals. In this modification, the common on/off command signal is inputted to the drive circuits 21 and 22, and the voltage variation control section 31.

The current supply wires and the current supply transistors may be three or more in number. The current supply transistors may be P-channel MOSFETs. The current supply transistors may be IGBTs or bipolar transistors. In a case where bipolar transistors, which are current-driven type transistors, are used as the current supply transistors, the low current supply performance state can be achieved by reducing a current supplied to the base terminal as a control terminal of each current supply transistor.

The relay coil 13a may be a low side driven relay coil. In this case, one end of the relay coil 13a is connected to the positive terminal of the battery 15, the other end of the relay coil 13a is connected to the terminal 19 of the ECU 11, and the terminal 17 of the ECU 11 is connected to the ground line. Accordingly, the portions designated by LD1 and LD2 of the current supply wires L1 and L2 in FIG. 1 correspond to the load side portions, and the portions designated by LS1 and LS2 correspond to the opposite load side portions.

In the above embodiment, the relay coil 13a of the relay 13 is the electrical load as an object to be supplied with a current. However, the electrical load as an object to be supplied with a current is not limited to the relay coil 13a. For example, it may be an actuator such as an electrical motor whose output power depends on a current supplied. In this case, in addition to, or instead of steps S240 and S250, a step for determining whether or not a current supplied to the actuator should be increased as much as possible is provided in the process shown in FIG. 5, and if the determination result in this step is affirmative, the process proceeds to step S270.

The above explained preferred embodiments are exemplary of the invention of the present application which is described solely by the claims appended below. It should be understood that modifications of the preferred embodiments may be made as would occur to one of skill in the art.

What is claimed is:

1. An electrical load driving apparatus comprising:
   a plurality of current supply wires connected in parallel with one another, each of the current supply wires being connected to one of a high side terminal and a low side terminal of a power source at one end thereof, and being connected to one end of an electrical load at the other end thereof, the other end of the electrical load being electrically connected with the other end of the high side terminal and the low side terminal of the power source;
   a plurality of current supply transistors each having one control terminal and two output terminals, each of the current supply transistors being interposed in a corresponding one of the current supply wires at the two output terminals to supply a current to the electrical load when being turned on during a current supply period in which the electrical load is supplied with the current continuously;
   a check period generating means for generating, within the current supply period, a check period in which all of the current supply transistors are turned on in a low current supply performance state where a voltage difference between the two output terminals of each of the current supply transistors is higher than or equal to a predetermined voltage; and
   a wire breakage determination means connected to the two output terminals of each current supply transistor to detect whether or not the voltage difference between the two output terminals of any one of the current supply transistors is lower than the predetermined voltage, and determine, upon detecting that the voltage difference between the two output terminals of one of the current supply transistors is lower than the predetermined voltage, that the current supply wire interposed by the detected current supply transistor is broken at an opposite load side portion thereof located on the opposite side of the detected current supply transistor with respect to the electrical load.

2. The electrical load driving apparatus according to claim 1, wherein the check period generating means generates the check period intermittently within the current supply period.

3. The electrical load driving apparatus according to claim 1, further comprising an abnormality handling means configured to monitor the voltage difference between the two output terminals of at least one of the current supply transistors during the current supply period, and inhibits the check period generating means from operating upon detecting that the voltage difference exceeds an abnormality detection threshold.

4. The electrical load driving apparatus according to claim 3, further comprising a check ending means configured to inhibit the check period generation means from operating when the wire breakage determining means determines that a wire breakage is present in any one the current supply wires.

5. The electrical load driving apparatus according to claim 1, wherein
   the current supply transistors are voltage-driven type transistors,
   the electrical load driving apparatus further comprises a drive means configured to apply a drive voltage to the control terminals of the current supply transistors to turn on the current supply transistors during the current supply period,
   the check period generating means is configured to adjust the drive voltage applied to each current supply transistor to be turned on in the low current supply performance state so that each current supply transistor is turned on incompletely, and
   the electrical load driving apparatus further comprises an auxiliary voltage supply means for applying an auxiliary drive voltage to the control terminals of the current supply transistors to be turned on in the low current supply performance state as the drive voltage.

6. The electrical load driving apparatus according to claim 1, further comprising a check interruption means configured to inhibit the check period generating means from operating upon detecting that the electrical load is in a specific condition.

7. The electrical load driving apparatus according to claim 6, wherein the specific condition is that the voltage of the power source is lower than a predetermined voltage.

* * * * *